(12) United States Patent
Zhou et al.

(10) Patent No.: US 11,495,043 B2
(45) Date of Patent: Nov. 8, 2022

(54) OPTICAL FINGERPRINT IDENTIFICATION UNIT, DISPLAY PANEL, METHOD FOR MANUFACTURING OPTICAL FINGERPRINT IDENTIFICATION UNIT AND METHOD FOR IDENTIFYING FINGERPRINT

(71) Applicant: BOE TECHNOLOGY GROUP CO., LTD., Beijing (CN)

(72) Inventors: Tianmin Zhou, Beijing (CN); Lizhong Wang, Beijing (CN); Rui Huang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 771 days.

(21) Appl. No.: 16/412,644

(22) Filed: May 15, 2019

(65) Prior Publication Data
US 2020/0074139 A1    Mar. 5, 2020

(30) Foreign Application Priority Data

Aug. 31, 2018   (CN) .......................... 201811012779.3

(51) Int. Cl.
*G06V 40/13*    (2022.01)
*H01L 27/32*    (2006.01)
(Continued)

(52) U.S. Cl.
CPC ...... *G06V 40/1318* (2022.01); *H01L 27/3234* (2013.01); *H01L 27/3258* (2013.01);
(Continued)

(58) Field of Classification Search
CPC ............ H01L 27/3234; H01L 27/3258; H01L 27/3272; H01L 51/56; H01L 27/14678;
(Continued)

(56) References Cited

U.S. PATENT DOCUMENTS

| 2011/0043473 A1* | 2/2011 | Kozuma | G06F 3/042 345/173 |
| 2015/0369661 A1* | 12/2015 | Lin | G06V 40/1318 250/227.11 |

(Continued)

FOREIGN PATENT DOCUMENTS

| CN | 102920462 A | 2/2013 |
| CN | 106874866 A | 6/2017 |

(Continued)

OTHER PUBLICATIONS

"First Office Action and English language translation", CN Application No. 201811012779.3, dated Jun. 1, 2021, 23 pp.

*Primary Examiner* — Kevin Quarterman
(74) *Attorney, Agent, or Firm* — Myers Bigel, P.A.

(57) ABSTRACT

The present disclosure provides an optical fingerprint identification unit, a display panel, a method for manufacturing an optical fingerprint identification unit and a method for identifying a fingerprint. The optical fingerprint identification unit includes a substrate, and a light source, a photoluminescent layer and a light sensor above the substrate. The light source is configured to emit visible light. The photoluminescent layer is configured to receive the visible light reflected by a fingerprint and convert the received visible light into non-visible light. The light sensor is configured to detect the non-visible light.

12 Claims, 4 Drawing Sheets

(51) Int. Cl.
*H01L 51/56* (2006.01)
*H01L 27/146* (2006.01)

(52) U.S. Cl.
CPC .......... *H01L 27/3272* (2013.01); *H01L 51/56* (2013.01); *H01L 27/14678* (2013.01); *H01L 2227/323* (2013.01)

(58) Field of Classification Search
CPC .......... H01L 2227/323; G06V 40/1318; G06V 10/143; G06V 10/147
See application file for complete search history.

(56) References Cited

U.S. PATENT DOCUMENTS

| | | | |
|---|---|---|---|
| 2018/0210571 A1* | 7/2018 | Wang | .................... G06F 3/0412 |
| 2019/0172886 A1 | 6/2019 | Ma et al. | |
| 2019/0213379 A1 | 7/2019 | Zhao et al. | |
| 2020/0134281 A1 | 4/2020 | Han et al. | |
| 2021/0358984 A1* | 11/2021 | Liu | ................... H01L 27/14623 |

FOREIGN PATENT DOCUMENTS

| | | | |
|---|---|---|---|
| CN | 106959757 A | 7/2017 | |
| CN | 107978624 A | 5/2018 | |
| CN | 108288681 A | 7/2018 | |

* cited by examiner

OPTICAL FINGERPRINT IDENTIFICATION UNIT, DISPLAY PANEL, METHOD FOR MANUFACTURING OPTICAL FINGERPRINT IDENTIFICATION UNIT AND METHOD FOR IDENTIFYING FINGERPRINT

CROSS REFERENCE TO RELATED APPLICATION

The present application claims the priority of Chinese Patent Application No. 201811012779.3 filed on Aug. 31, 2018, the content of which is incorporated herein by reference in its entirety.

FIELD

The present disclosure generally relates to the field of fingerprint identification, and more particularly to an apparatus and method for conducting optical fingerprint identification under a screen.

BACKGROUND

Fingerprint identification under a screen, that is, fingerprint identification within the screen, is a solution for implementing the fingerprint identification function under the trend of full screen. In the common screen fingerprint identification technologies, both ultrasonic fingerprint identification and optical fingerprint identification have certain defects.

SUMMARY

According to an aspect of the present disclosure, there is provided an optical fingerprint identification unit, comprising a substrate, and a light source, a photoluminescent layer and a light sensor above the substrate. The light source is configured to emit visible light, the photoluminescent layer is configured to receive the visible light reflected by a fingerprint and convert the received visible light into non-visible light, and the light sensor is configured to detect the non-visible light.

In some embodiments, the non-visible light comprises infrared light and the light sensor comprises an infrared sensor.

In some embodiments, the photoluminescent layer comprises an exiting surface configured to receive the visible light reflected by the fingerprint and emit the non-visible light, and the light sensor comprises a light receiving member configured to receive the non-visible light, wherein an orthographic projection of the exiting surface on the substrate at least partially coincides with an orthographic projection of the light receiving member on the substrate.

In some embodiments, the light sensor is at a side of the photoluminescent layer away from the substrate, the exiting surface is at the side of the photoluminescent layer away from the substrate, and the light receiving member faces the substrate.

In some embodiments, the light sensor comprises an opaque electrode provided on a side of the light sensor away from the photoluminescent layer.

In some embodiments, an orthographic projection of a geometric center of the exiting surface on the substrate coincides with an orthographic projection of a geometric center of the light receiving member on the substrate.

In some embodiments, an area of the light receiving member is greater than or equal to an area of the exiting surface.

In some embodiments, the optical fingerprint identification unit further comprises a shield that comprises a first opening, an orthographic projection of the first opening on the substrate coincides with the orthographic projection of the exiting surface on the substrate.

In some embodiments, the optical fingerprint identification unit further comprises a planarization layer that comprises a second opening, wherein the light sensor is inside the second opening.

In some embodiments, a material of the photoluminescent layer comprises a rare earth material or a quantum dot material.

In some embodiments, the light source comprises an OLED light source.

According to another aspect of the present disclosure, there is provided a display panel, comprising the optical fingerprint identification unit according any of the embodiments of the present disclosure.

According to yet another aspect of the present disclosure, there is provided a method for identifying a fingerprint, comprising:
   receiving, by a photoluminescent layer, visible light reflected by the fingerprint,
   converting the visible light into non-visible light by the photoluminescent layer, and
   receiving the non-visible light by a light sensor.

In some embodiments, the light sensor comprises a non-visible light sensor.

In some embodiments, the non-visible light comprises infrared light and the non-visible light sensor comprises an infrared sensor.

According to still another aspect of the present disclosure, there is provided a method for manufacturing an optical fingerprint identification unit, comprising
   providing a substrate,
   providing, above the substrate, a photoluminescent layer with an exiting surface,
   providing, above the photoluminescent layer, a drive circuit and a interlayer dielectric layer at least partially covering the drive circuit,
   providing a transparent electrode on the interlayer dielectric layer,
   providing a planarization layer on the interlayer dielectric layer, wherein the planarization layer covers the transparent electrode,
   performing a trenching process to the planarization layer to expose the transparent electrode,
   providing a photosensitive layer on the transparent electrode and providing an opaque electrode on the photosensitive layer, and
   providing an anode, an electroluminescent layer and a cathode above the planarization layer, wherein the anode is electrically connected to the drive circuit.

In some embodiments, the method for manufacturing the optical fingerprint identification unit further comprises:
   providing a shield on the photoluminescent layer, wherein the shield defines the exiting surface.

In some embodiments, the electroluminescent layer is configured to emit visible light, the photoluminescent layer is configured to convert the visible light into infrared light, and the photosensitive layer comprises an infrared photosensitive layer.

BRIEF DESCRIPTION OF DRAWINGS

These and other aspects of the application are apparent from the embodiments described below and will be further elucidated, by way of example, with reference to the drawings, in which.

DETAILED DESCRIPTION

In order to achieve a full screen display, a solution is to place the fingerprint identification device, in particular the fingerprint receiving surface of the fingerprint identification device, on the back of the display device. In this solution, it is required to open a hole or dig a groove in the back cover of the display device. This complicates the process of manufacturing the display device, increases the cost, and reduces the strength of the back cover. Moreover, such fingerprint identification on back cover can only be performed at a specific location, which lowers the convenience.

Another solution is to integrate the fingerprint identification device into the display surface of the display device. This technique is commonly referred to fingerprint-on-display or in-display-fingerprint. In order to achieve the in-display-fingerprint identification, there are usually two options. One is the ultrasonic fingerprint identification, and the other one is the optical fingerprint identification.

With respect to the ultrasonic fingerprint identification technology, ultrasonic signal has good penetrability, which can reduce the interference from dirt, grease and sweat of finger, and help to identify fingerprints under water. However, according to the feedback of the users, there are still some problems in the recognition rate. Moreover, the cost of the ultrasonic fingerprint identification device is relatively high.

With respect to the optical fingerprint identification technology, the traditional optical fingerprint identification technology has many disadvantages. For example, the degree of finger cleanliness has a greater influence to the recognition rate, and the recognition rate for dry fingers is low. A more serious drawback is that the fingerprint identification module used in the traditional optical fingerprint identification technology is bulky because it requires an independent optical system and is therefore not suitable for being used on mobile devices. Other optical fingerprint identification techniques use the light from the screen as a light source. For example, in a mobile phone using an AMOLED display screen, the optical in-display-fingerprint identification technology illuminates the fingerprint with the light emitted from the AMOLED display screen, and then the light reflected by the fingerprint illuminates the contact image sensor (CIS) under the screen through the screen. After that, the fingerprint identification can be realized by analyzing the reflected light by means of a specific algorithm. However, this technology also has some problems. For example, when the brightness of the screen is insufficient, or when the displayed image of the area of the screen that is being pressed by the fingerprint may cause interference, the result of the fingerprint identification may be largely deviated. "Always-On-Display" can avoid the interference of displayed images to a certain extent. The so-called Always-On-Display refers to a display mode in which only a part of the pixels are lighted and information such as time, incoming call, push message, and the like is displayed in a partial area of the screen. This display mode usually displays a simple pattern and has less influence on optical fingerprint identification. However, if you want to identify the fingerprint when the screen is completely black, you need to wake up the screen first, or keep the fingerprint identification area always on-display. However, a long time Always-On-Display in the fingerprint identification area will rapidly reduce the life of the OLEDs in that area. Moreover, "Always-On-Display" cannot change the need for identifying fingerprint on the screen where the image is being displayed. It is still difficult to implement fingerprint identification when the screen is displaying various images.

Another optical fingerprint identification device utilizes infrared emitters and sensors embedded in the display screen to detect fingerprints. This technology can be applied to specific areas of the screen as well as to the entire screen. However, this technique requires the entire screen to be arranged with micro infrared light emitters in a high density, so the cost is high.

There is therefore a need in the art for an apparatus that enables a low cost in-display-fingerprint identification which is not interfered by displayed images and has a relatively long lifetime.

Figure 1:
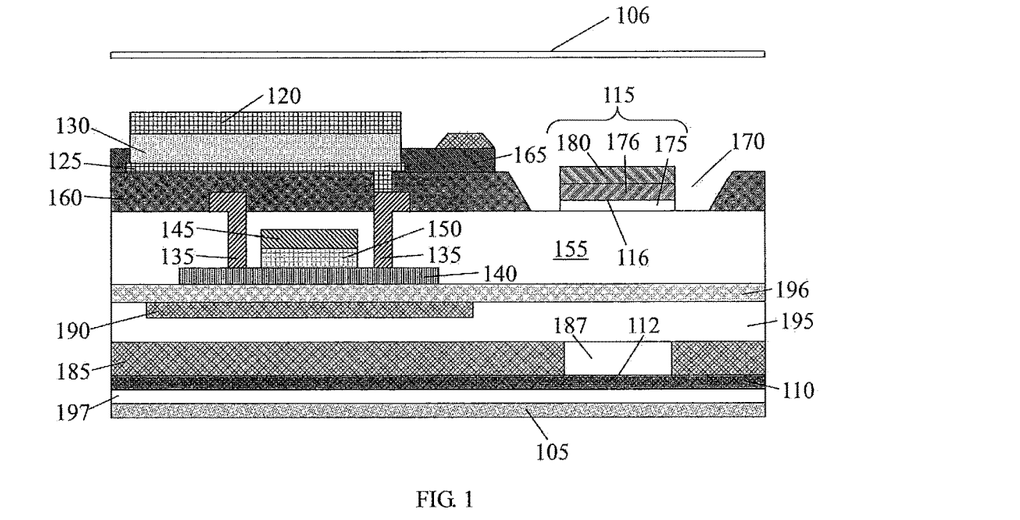
FIG. 1 schematically shows a structure of the optical fingerprint identification unit according to an embodiment of the present disclosure.

According to an aspect of the present disclosure, there is provided an optical fingerprint identification unit. FIG. 1 schematically shows the structure of an optical fingerprint identification unit according to an embodiment of the present disclosure. The optical fingerprint identification unit comprises a substrate 105, a light source, a photoluminescent layer 110, and a light sensor 115. When implementing fingerprint identification, the fingerprint is placed on a fingerprint identification surface 106. In some embodiments, the substrate 105 can be a flexible substrate or a glass substrate. The light source, the photoluminescent layer 110 and the light sensor 115 are all disposed on/above the substrate 105. The fingerprint identification surface 106 can be a glass cover. When recognizing the fingerprint, in the perspective of FIG. 1, the finger is positioned above the light source and is pressing the fingerprint identification surface 106. The light source is configured to emit visible light, which is illuminated on the fingerprint pressed on the fingerprint identification surface 106. The visible light is casted to the photoluminescent layer 110 through the reflection of the fingerprint. The photoluminescent layer 110 is configured to receive the visible light reflected by the fingerprint and convert the received visible light into non-visible light and to emit the non-visible light to the light sensor 115. The light sensor 115 is configured to detect the non-visible light and then convert the optical signal into an electrical signal. The electrical signal can be processed to identify a pattern of the fingerprint.

The principle of the fingerprint identification according to the present disclosure is as follows. It is known that a fingerprint is distributed with valleys and ridges, so the curvatures of parts of the fingerprint are different. The visible light emitted by the light source is casted to illuminate the photoluminescent layer 110 under the co-influence of the fingerprint and the fingerprint identification surface 106. Positions with different curvatures have different reflective effects to the light source's light. For example, the visible light that undergoes the valley and the fingerprint identification surface 106 travels toward the photoluminescent layer 110 as reflected light, while the visible light that undergoes the ridge and fingerprint identification surface 106 travels toward the photoluminescent layer 110 as scattered light, and visible lights in the two situations have different properties, e.g., the intensity of the two lights are different. Therefore, in the photoluminescent layer 110, the intensity of non-visible light excited by these two visible lights is also different. The light sensor 115 can be used to detect the properties of the non-visible light, and further, the properties of the visible light can be obtained according to the properties of the photoluminescent layer 110, so as to determine the curvature of the position that reflects the visible light, thereby obtaining a pattern of the fingerprint.

On the other hand, the photoluminescent material can absorb a visible light of a wavelength and emit a non-visible light of another wavelength by the Stokes effect. The light sensor 115 can be configured to detect only non-visible light and be substantially unaffected by visible light. Thus, no matter what image is being displayed on the device screen, the detection of the light sensor 115 is not affected, and the non-visible light emitted by the photoluminescent layer 110 does not affect the visible light emitted by the screen, thereby not affecting the display effect. In a specific embodiment, the non-visible light is infrared light and, correspondingly, the light sensor 115 is an infrared sensor. In other embodiments of the present disclosure, the optical fingerprint identification unit may also be specifically described by taking an infrared sensor as an example. The non-visible light in the present disclosure may also be ultraviolet (UV) light. When UV light is applied, the photoluminescent materials being used may be different. For example, the photoluminescent material applied at this example may be an upconverting optical material such as an upconverting nanoparticle material or the like.

In some embodiments, the light source comprises a cathode 120, an anode 125, and an electroluminescent layer 130 sandwiched between the cathode 120 and the anode 125. The light source also comprises a thin film transistor. The thin film transistor comprises a source and drain 135. The term "source and drain" refers to a structure having two portions, any one of which can be used as a source and the rest one can be used as a drain. The thin film transistor further comprises an active layer 140 connected between the source and drain 135, a gate 145, and a gate insulating layer 150 connected between the active layer 140 and the gate 145. The anode 125 is connected to the source and drain 135. In a specific embodiment, the drain in the source and drain 135 is connected to the anode 125. The thin film transistor is configured to control the illumination of the electroluminescent layer 130. In addition, the thin film transistor also comprises an interlayer dielectric layer 155. The interlayer dielectric layer 155 at least partially surrounds the gate 145, the gate insulating layer 150 and the active layer 140. The source and drain 135 is connected to the active layer 140 through the interlayer dielectric layer 155. A planarization layer 160 is disposed on a side of the interlayer dielectric layer 155 away from the substrate 105. The anode 125 is disposed on the planarization layer 160. The thin film transistor also comprises a pixel definition layer 165 that is also disposed on the planarization layer 160 and partially covers the anode 125. A shield can also be arranged in the optical fingerprint identification unit. The shield can comprise a first opening 187. In some embodiments, the shield is a black matrix layer 185. The light reflected by the fingerprint passes through the first opening to reach the photoluminescent layer 110. The non-visible light emitted by the photoluminescent layer 110 is incident on the light sensor 115 through the first opening 187. In some embodiments, the material of photoluminescent layer 110 can be a rare earth or a quantum dot material. The material of photoluminescent layer 110 depends on the type of light source. In particular, it is desirable that the light source be mated with the photoluminescent layer 110 such that all visible light that illuminates the photoluminescent layer 110 can be converted to a non-visible light rather than to another kind of visible light of another wavelength. As noted above, in some embodiments, the photoluminescent layer 110 converts visible light into infrared light. When the material of photoluminescent layer 110 is a rare earth material, if the light source emits blue light, the rare earth material may be europium. If the light source emits green light, the rare earth material can be erbium.

The planarization layer 160 is generally opaque. A second opening 170 is present in the planarization layer 160. The shape of the second opening 170 is not limited by the present disclosure, and may be, for example, a regular shape such as a rectangle or an irregular shape. The visible light reflected by the fingerprint is incident on the photoluminescent layer 110 through the second opening 170. A portion of the interlayer dielectric layer 155 is exposed through the second opening 170. In the second opening 170, the transparent electrode, the photosensitive layer 176, and the opaque electrode 180 are sequentially disposed on the interlayer dielectric layer 155 in a direction away from the substrate 105. In some embodiments, the transparent electrode can be an indium tin oxide (ITO) electrode 175. The non-visible light emitted by the photoluminescent layer 110 is irradiated to the light sensor 115 through the ITO electrode 175. The ITO electrode 175 and the opaque electrode 180 can transmit the electrical signal generated by the photosensitive layer 176 to a processor to analyze the non-visible light. Due to its opaque properties, the opaque electrode 180 prevents external visible light (including the visible light reflected by the fingerprint and the ambient light) from directly illuminating the photosensitive layer 176, thereby improving the measurement accuracy.

As described above, the visible light passes through the first opening 187 of the shield to illuminate the photoluminescent layer 110, and the non-visible light passes through the first opening 187 to illuminate the light sensor 115. Therefore, not every portion of the photoluminescent layer 110 receives the visible light and emits the non-visible light to the light sensor 115. The portion of the photoluminescent layer 110 that actually receives the visible light and emits the non-visible light is limited by the shield. The shield defines an exiting surface 112 for the photoluminescent layer 110 that receives the visible light reflected by the fingerprint and emits the non-visible light. The shield limits the position and size of the exiting surface 112. It will be appreciated that, in an embodiment, the orthographic projection of the first opening 187 on the substrate 105 coincides with the orthographic projection of the exiting surface 112 on the substrate 105.

Figure 2:
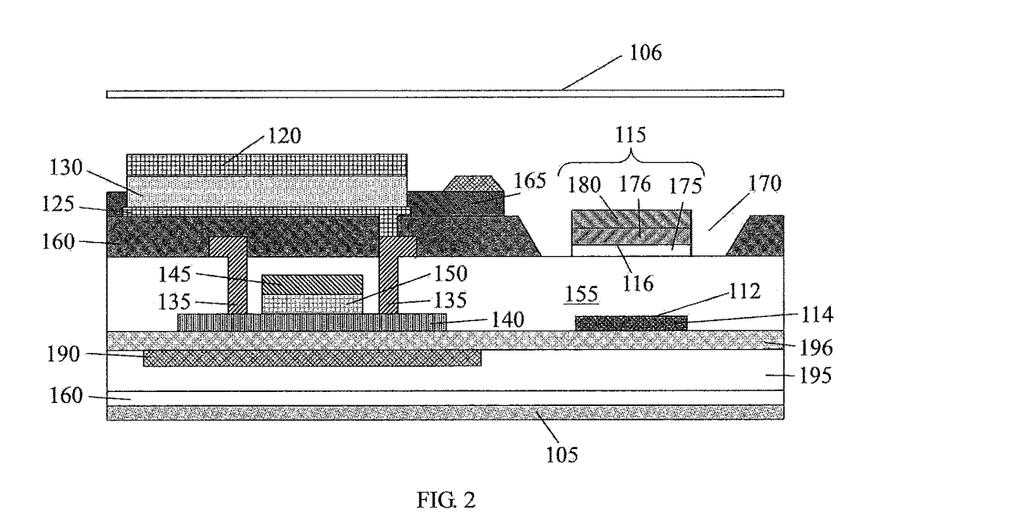
FIG. 2 schematically shows a structure of the optical fingerprint identification unit in accordance with another embodiment of the present disclosure.

However, the method of defining an exiting surface 112 is not unique. FIG. 2 schematically shows the structure of an optical fingerprint identification unit in accordance with another embodiment of the present disclosure. As shown in FIG. 2, unlike the embodiment in which a full layer of photoluminescent layer 110 is disposed, a photoluminescent structure 114 may be disposed only at a certain location of the optical fingerprint identification unit, and its orthographic projection on the substrate 105 does not cover the entire substrate 105. In this case, the surface of the photoluminescent structure 114 facing the light sensor 115 is the exiting surface 112.

A light receiving member 116 is provided at a side of the photosensitive layer 176 facing away from the substrate 105. The light receiving member 116 is for receiving the non-visible light emitted by the exiting surface 112. In some embodiments, in order for the light emitted by the exiting surface 112 to be received by the light sensor 115 as much as possible, the area of the light receiving member 116 is greater than or equal to the area of the exiting surface 112. Obviously, since the light sensor 115 is disposed in the second opening 170, and the visible light reflected by the fingerprint needs to pass through the other portion of the second opening 170 to illuminate the photoluminescent layer 110 and finally illuminate the light sensor 115, the area of the second opening 170 is larger than the area of the exiting surface 112. In some embodiments, the area of the second opening 170 can be about 1.5 to 5 times the area of the exiting surface 112 to allow an appropriate amount of visible light to illuminate the photoluminescent layer 110 through the second opening 170 and enable the visible light to cause an appropriate amount of signal, and the area of the second opening 170 is not too large so as to affect the measurement accuracy. In an embodiment, the area of the second opening 170 is selected such that the projection of the second opening 170 on the substrate 105 covers as total as possible the projection of the exiting surface 112 on the substrate 105. In some embodiments, the orthographic projection of the exiting surface 112 on the substrate 105 at least partially coincides with the orthographic projection of the light receiving member 116 on the substrate 105. That is, in the perspective of FIG. 1, at least a portion of the light receiving member 116 is located directly above the exiting surface 112 such that the exiting surface 112 and the light sensor 115 can be aligned to some extent in the horizontal direction. By making the alignment as large as possible, the light emitted by the exiting surface 112 can be made to illuminate only the light sensor 115 in the optical fingerprint identification unit in which the exiting surface 112 is located, without illuminating the light sensor 115 of the other optical fingerprint identification units. The above alignment can be achieved by setting the position of the first opening 187 of the black matrix layer 185 or setting the position of the photoluminescent structure 114, thereby improving the detection accuracy of the light sensor 115. In some embodiments, the orthographic projection of the geometric center of the exiting surface 112 on the substrate 105 coincides with the orthographic projection of the geometric center of the light receiving member 116 on the substrate 105. Thus, the exiting surface 112 is aligned to the maximum extent with the light receiving member 116, so that the detection accuracy is further improved. Since the first opening 187 of the black matrix layer 185 defines the location and size of the exiting surface 112, the above alignment can be achieved by the specific design of the black matrix layer 185 and the first opening 187.

The black matrix layer 185 is only an embodiment of the shield. In some embodiments, the shield may also be a light blocking member 190 of the thin film transistor.

The amount of light that the photoluminescent layer 110 illuminates to the light receiving member 116 can also be controlled by designing the extension of the light blocking member 190 in a direction parallel to the substrate 105. For example, the light blocking member 190 can also comprises a first opening 187, whose projection on the substrate 105 coincides with the projection of the exiting surface 112 on the substrate 105, or the projection of its geometric center on the substrate 105 can coincide with the projections of the geometric center of the exiting surface 112 on the substrate 105. It should be understood that the optical fingerprint identification unit according to the embodiment of the present disclosure may comprises the black matrix layer 185 and the light blocking member 190 at the same time, or simply comprises one of them.

In the embodiment shown in FIG. 1, the photoluminescent layer 110 is disposed below the thin film transistor in a direction perpendicular to the substrate 105. However, the position of the photoluminescent layer 110 or the photoluminescent structure 114 is not limited thereto. For example, the photoluminescent structure 114 can be disposed in the interlayer dielectric layer 155. In other embodiments, the thin film transistor further comprises a first barrier layer 195. The photoluminescent structure 114 can be disposed in the first barrier layer 195.

The optical fingerprint identification unit according to an embodiment of the present disclosure may further comprise a buffer layer 196 and a second barrier layer 197.

Although the light source and infrared sensor 105 are disposed on the same side of the photoluminescent layer 110 in FIG. 1, they may be disposed on different sides of the photoluminescent layer 110. For example, in the direction shown in FIG. 1, the infrared sensor 115 may also be disposed under the photoluminescent layer 110. In this situation, the visible light is directed downward to illuminate the photoluminescent layer 110, and the non-visible light from the photoluminescent layer 110 is directed downward to illuminate the infrared sensor 115. In this arrangement, the photoluminescent layer 110 is typically required to be thin. For the photoluminescent layer 110 of the quantum dot material, the thickness of a thin photoluminescent layer 110 is substantially in the range of 50 to 500 Å. For the photoluminescent layer 110 of the rare earth material, the thickness of a thin photoluminescent layer 110 is substantially below 200 nm, for example, in the range of 10 nm to 200 nm. In this arrangement, the two electrodes of the light sensor 115 need not be transparent. In other words, the light sensor 115 does not require an opaque electrode to block the external light.

Since the optical fingerprint identification unit according to the embodiment of the present disclosure identifies a fingerprint by using the infrared light different from visible light, the normal display will not be disturbed with respect to the color. At the same time, since the process for manufacturing the fingerprint identification system and the process for manufacturing the display system are combined, and there is no need to add an infrared light emitter module, the technical problems and yield drop caused by excessive processes are avoided.

According to another aspect of the present disclosure, there is provided a display panel comprising the optical fingerprint identification unit according to the foregoing embodiment.

Figure 3:
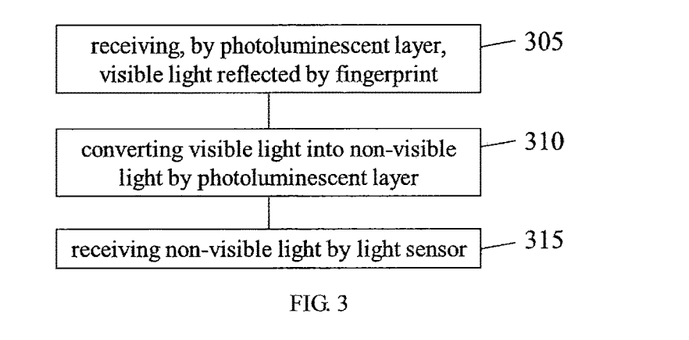
FIG. 3 schematically shows the steps of the method for identifying a fingerprint.

According to yet another aspect of the present disclosure, there is provided a method for identifying a fingerprint. FIG. 3 schematically shows the steps of the method for identifying the fingerprint. The method comprises:

Step S305: receiving, by a photoluminescent layer, visible light reflected by the fingerprint, Step S310: converting the visible light into non-visible light by the photoluminescent layer, and Step S315: receiving the non-visible light by a light sensor.

In this method, the fingerprint reflects the visible light emitted by the pixel to the photoluminescent layer. Then, the visible light stimulates the photoluminescent layer to emit the non-visible light. The light sensor receives the non-visible light to determine the properties of the visible light that illuminates the photoluminescent layer to determine the curvature of portion of the fingerprint that reflects the visible light. Because the reflection effects of places with different curvatures (e.g., valleys, ridges, etc.) on the fingerprint are different, the properties of the visible light that illuminate the photoluminescent layer are different, so the properties of the non-visible light stimulated by the visible light are different. By detecting the properties of the non-visible light by the light sensor, after calculating, the curvature of the portion of the fingerprint corresponding to the optical fingerprint identification unit where the photoluminescent layer and the light sensor are located can be determined, thereby obtaining the pattern of the fingerprint. This method does not require an individual light source that emits non-visible light and is not affected by the pattern displayed on the screen.

In an embodiment of the method for identifying a fingerprint according to the present disclosure, the light sensor is a non-visible light sensor. Therefore, the visible light emitted by the screen does not interfere with the non-visible light detected by the light sensor, which enhances the detection accuracy.

Figure 4:
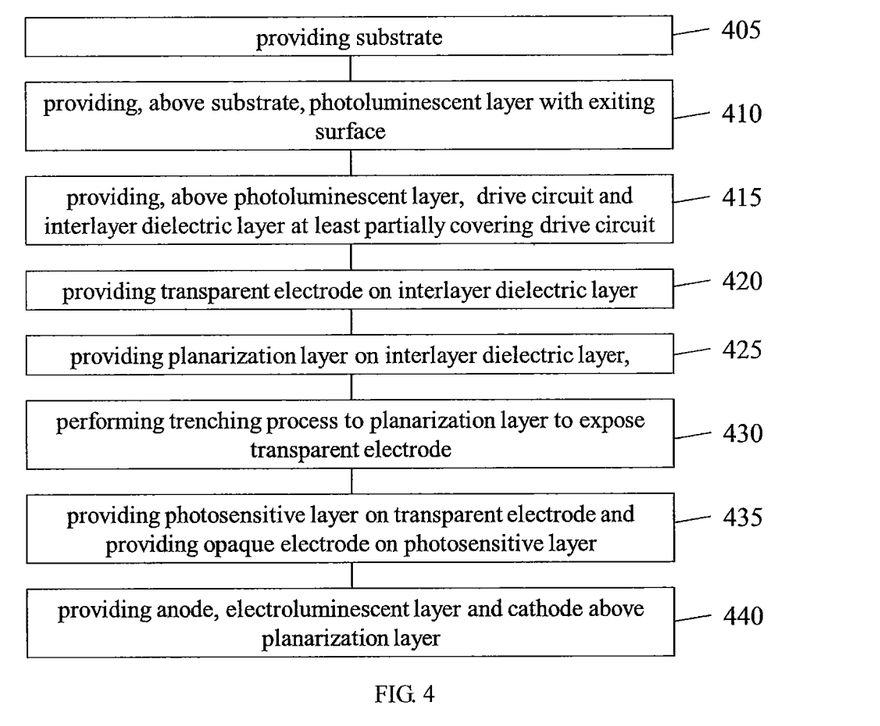
FIG. 4 schematically shows a flow chart of a method for manufacturing an optical fingerprint identification unit according to an embodiment of the present disclosure.

According to still another aspect of the present disclosure, there is also provided a method for manufacturing an optical fingerprint identification unit. FIG. 4 schematically shows a flow chart of the method for manufacturing an optical fingerprint identification unit according to an embodiment of the present disclosure. FIG. 5A-5F show the morphologies of the optical fingerprint identification unit in the various steps of the method.

The method comprises the following steps:

Step 405: providing a substrate,

Step 410: providing, above the substrate, a photoluminescent layer with an exiting surface, Step 415: providing, above the photoluminescent layer, a drive circuit and an interlayer dielectric layer at least partially covering the drive circuit, Step 420: providing a transparent electrode on the interlayer dielectric layer, Step 425: providing a planarization layer on the interlayer dielectric layer, wherein the planarization layer covers the transparent electrode, Step 430: performing a trenching process on the planarization layer to expose the transparent electrode, Step 435: providing a photosensitive layer on the transparent electrode, and providing an opaque electrode on the photosensitive layer, and Step 440: providing an anode, an electroluminescent layer and a cathode above the planarization layer, wherein the anode is electrically connected to the drive circuit.

Figure 5A:
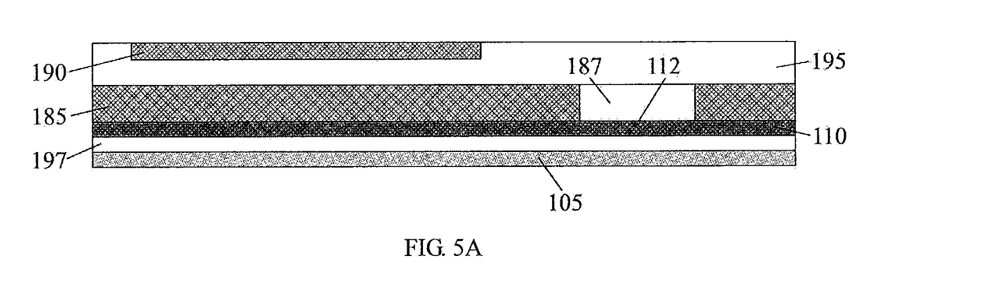
FIG. 5A-5F schematically show the morphologies of the structures of the optical fingerprint identification unit in the various steps of the method for manufacturing an optical fingerprint identification unit according to an embodiment of the present disclosure.

It should be understood that the term "above" refers to a comparative relationship between spatial locations. For example, the expression "providing, above the substrate, a photoluminescent layer with an exiting surface" does not mean that the photoluminescent layer is placed in direct contact with the substrate, but rather that the photoluminescent layer is spatially at a higher position. In the method for manufacturing an optical fingerprint identification unit, a substrate 105 is firstly provided. The substrate can be a flexible substrate or a glass substrate. Optionally, a second barrier layer 197 is provided on the substrate 105. Thereafter, a photoluminescent layer 110 is provided on the substrate 105 or the second barrier layer 197 (if any). To define the exiting surface 112 of the photoluminescent layer 110 to improve the detection accuracy, a shield is provided on the photoluminescent layer. In an embodiment, the shield may be a black matrix layer 185. A first opening 187 can then be formed on the black matrix layer 185. The first opening 187 defines an exiting surface 112 of the photoluminescent layer 110. A first barrier layer 195 is then formed over the shield. In another embodiment, the first barrier layer 195 can be formed directly on the photoluminescent layer 110 without forming the black matrix layer 185. A light blocking member 190 is then formed on the first barrier layer 195. In still another embodiment, it is possible to both forming the black matrix layer 185 and forming the light blocking member 190. For example, the black matrix layer 185 and the first opening 187 are formed firstly, and then the first barrier layer 195 is formed and the light blocking member 190 is formed on the first barrier layer 195. Up to this stage, the morphology of the formed optical fingerprint identification unit is as shown in FIG. 5A.

Figure 5B:
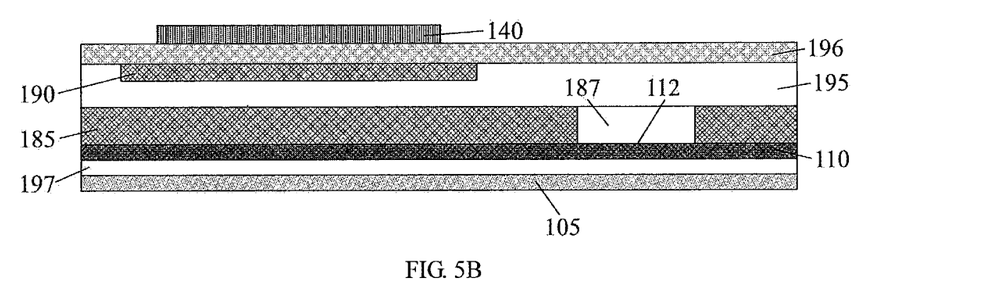

Then, a buffer layer 196 is formed on the first barrier layer 195. The active layer 140 of the drive circuit can then be formed on the buffer layer 196 by a patterning process. Up to this stage, the morphology of the formed optical fingerprint identification unit is as shown in FIG. 5B.

Figure 5C:
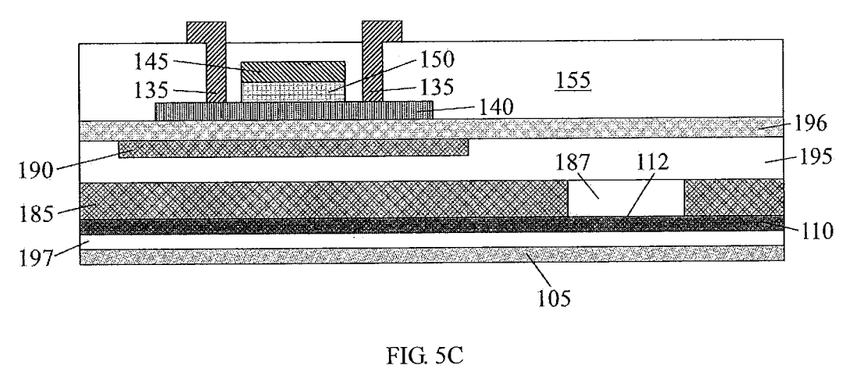

Then, an active layer 140, a gate insulating layer 150, and a gate 145 are formed on the buffer layer 196. The three structures may be formed one after another, that is, a structure is started to be formed after another structure has been formed. Alternatively, a layer of the material of the active layer, a layer of the material of the gate insulating layer, and a layer of the material of the gate layer may be formed firstly, and then the three layers are patterned. An interlayer dielectric layer 155 is then formed and vias are formed in the interlayer dielectric layer 155. The material of the source and drain is then deposited in the vias to form the source and drain 135. The source and drain 135 can extend beyond the interlayer dielectric layer 155. Up to this stage, the morphology of the formed optical fingerprint identification unit is as shown in FIG. 5C.

Figure 5D:
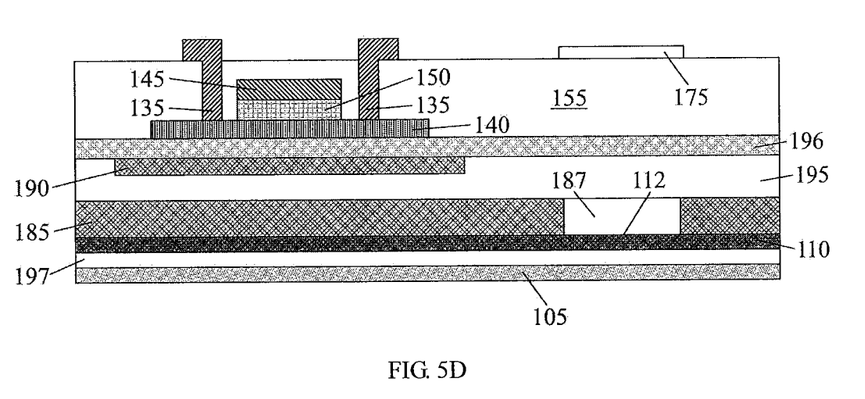

Thereafter, a transparent electrode can be formed on the interlayer dielectric layer 155 by a patterning process. In an embodiment, the transparent electrode is an ITO electrode 175. Up to this stage, the morphology of the formed optical fingerprint identification unit is as shown in FIG. 5D.

Figure 5E:
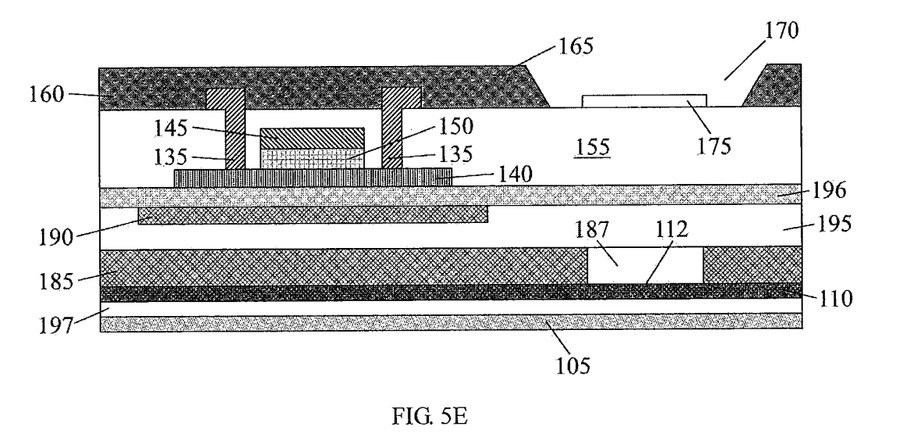

Then, a planarization layer 160 is formed on the interlayer dielectric layer 155. Then, trenching is performed at a position corresponding to the ITO electrode 175 to form the second opening 170 and expose the ITO electrode 175. The area of the second opening 170 may be 1.5 times or more the area of the exiting surface 112. Up to this stage, the morphology of the formed optical fingerprint identification unit is as shown in FIG. 5E.

Figure 5F:
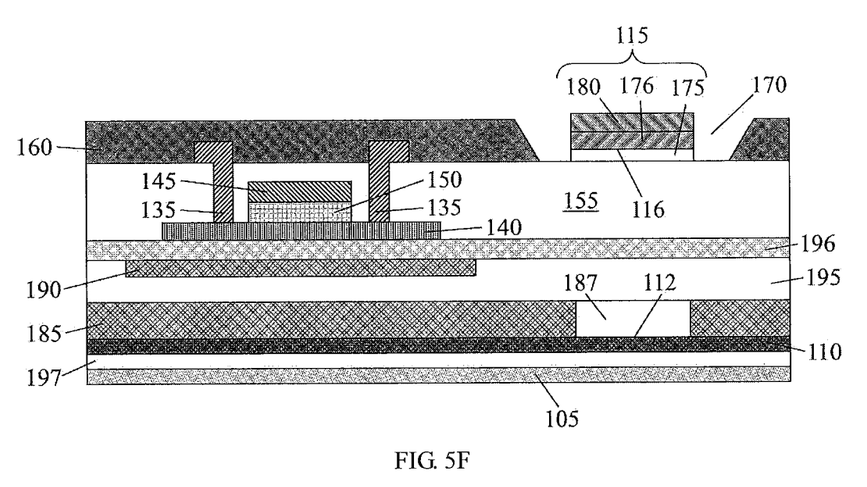

Then, a photosensitive layer 176 and an opaque electrode 180 are formed on the ITO electrode 175. Up to this stage, the morphology of the formed optical fingerprint identification unit is as shown in FIG. 5F. In an embodiment, the orthographic projection of the light sensor 115 on the substrate 105 at least partially coincides with the orthographic projection of the exiting surface 112 on the substrate 105. In a specific embodiment, the orthographic projection of the geometric center of the light sensor 115 on the substrate 105 coincides with the orthographic projection of the geometric center of the exiting surface 112 on the substrate 105. This coincidence enables the light emitted by the exiting surface 112 to be collected by the light sensor 115 as much as possible.

Finally, an anode 125, an electroluminescent layer 130, and a cathode 120 are formed on the planarization layer 160 to form an optical fingerprint identification unit as shown in FIG. 1. In an embodiment, the electroluminescent layer is configured to emit visible light, the photoluminescent layer is configured to convert the visible light into infrared light, and the light sensor is an infrared sensor.

In summary, the present disclosure provides an optical fingerprint identification unit, a display panel, a method for identifying a fingerprint, and a method for manufacturing an optical fingerprint identification unit. The optical fingerprint identification unit comprises a substrate; and a light source, a photoluminescent layer and a light sensor disposed on the substrate. The photoluminescent layer is configured to convert visible light from the light source into non-visible light. The light sensor is configured to detect the non-visible light.

The optical fingerprint identification unit according to the embodiment of the present disclosure converts visible light from a light source reflected by a fingerprint into non-visible light, and detects the non-visible light using a light sensor, and obtains a pattern of the fingerprint according to the properties of the non-visible light. Since the wavelengths of visible light and non-visible light are different, the visible light will not affect the detection of the non-visible light, and the non-visible light will not affect the display effect of the visible light. This increases the detection accuracy. Moreover, the optical fingerprint identification unit does not require an individual non-visible light source, thereby saving the costs.

It will be appreciated that the above embodiments have been described only by way of example. While embodiments have been illustrated and described in detail in the drawings and foregoing description, such illustration and description are to be considered illustrative or exemplary and not restrictive, and the application is not limited to the disclosed embodiments.

Other variations to the disclosed embodiments can be understood and effected by those skilled in the art in practicing the disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

We claim:

1. An optical fingerprint identification unit, comprising:
a substrate,
a light source,
a photoluminescent layer, and
a light sensor above the substrate,
wherein the light source is configured to emit visible light,
wherein the photoluminescent layer is configured to receive the visible light reflected by a fingerprint and convert the visible light that is received into non-visible light, and
wherein the light sensor is configured to detect the non-visible light.

2. The optical fingerprint identification unit of claim 1, wherein the non-visible light comprises infrared light, and wherein the light sensor comprises an infrared sensor.

3. The optical fingerprint identification unit of claim 1, wherein the photoluminescent layer comprises an exiting surface configured to receive the visible light reflected by the fingerprint and emit the non-visible light,
wherein the light sensor comprises a light receiving member configured to receive the non-visible light, and
wherein an orthographic projection of the exiting surface on the substrate at least partially coincides with an orthographic projection of the light receiving member on the substrate.

4. The optical fingerprint identification unit of claim 3, wherein the light sensor is at a side of the photoluminescent layer away from the substrate,
wherein the exiting surface is at the side of the photoluminescent layer away from the substrate, and
wherein the light receiving member faces the substrate.

5. The optical fingerprint identification unit of claim 4, wherein the light sensor comprises an opaque electrode provided on a side of the light sensor away from the photoluminescent layer.

6. The optical fingerprint identification unit of claim 3, wherein an orthographic projection of a geometric center of the exiting surface on the substrate coincides with an orthographic projection of a geometric center of the light receiving member on the substrate.

7. The optical fingerprint identification unit of claim 3, wherein an area of the light receiving member is greater than or equal to an area of the exiting surface.

8. The optical fingerprint identification unit of claim 3, further comprising:
a shield that comprises a first opening,
wherein an orthographic projection of the first opening on the substrate coincides with the orthographic projection of the exiting surface on the substrate.

9. The optical fingerprint identification unit of claim 1, further comprising:
a planarization layer that comprises a second opening,
wherein the light sensor is inside the second opening.

10. The optical fingerprint identification unit of claim 1, wherein a material of the photoluminescent layer comprises a rare earth material or a quantum dot material.

11. The optical fingerprint identification unit of claim 1, wherein the light source comprises an OLED light source.

12. A display panel, comprising the optical fingerprint identification unit according to claim 1.

* * * * *